(12) United States Patent
Pinel

(10) Patent No.: US 12,235,495 B2
(45) Date of Patent: Feb. 25, 2025

(54) LIGHT SOURCE COMPRISING AT LEAST ONE SEMICONDUCTOR CHIP BEARING AT LEAST ONE DIODE

(71) Applicant: CAILabs, Rennes (FR)

(72) Inventor: Olivier Pinel, Rennes (FR)

(73) Assignee: CAILabs, Rennes (FR)

( * ) Notice: Subject to any disclaimer, the term of this patent is extended or adjusted under 35 U.S.C. 154(b) by 259 days.

(21) Appl. No.: 17/596,919

(22) PCT Filed: Jun. 19, 2020

(86) PCT No.: PCT/FR2020/051076
§ 371 (c)(1),
(2) Date: Dec. 21, 2021

(87) PCT Pub. No.: WO2020/254774
PCT Pub. Date: Dec. 24, 2020

(65) Prior Publication Data
US 2022/0317389 A1     Oct. 6, 2022

(30) Foreign Application Priority Data
Jun. 21, 2019   (FR) ........................................ 1906718

(51) Int. Cl.
*G02B 6/42*     (2006.01)
*G02B 26/06*    (2006.01)
*G02B 27/09*    (2006.01)

(52) U.S. Cl.
CPC .......... *G02B 6/4206* (2013.01); *G02B 6/4202* (2013.01); *G02B 26/06* (2013.01); *G02B 27/0922* (2013.01); *G02B 27/0994* (2013.01)

(58) Field of Classification Search
CPC .............. G02B 6/4206; G02B 27/0922; G02B 27/0994; G02B 26/06
See application file for complete search history.

(56) References Cited

U.S. PATENT DOCUMENTS

| | | | |
|---|---|---|---|
| 5,513,201 A | 4/1996 | Yamaguchi et al. | |
| 6,404,951 B2 * | 6/2002 | Danziger | G02B 6/14 385/24 |

(Continued)

FOREIGN PATENT DOCUMENTS

| | | | | |
|---|---|---|---|---|
| CA | 2460129 C * | 6/2006 | ................ | G01J 3/02 |
| FR | 3049135 A1 * | 9/2017 | ............. | G02B 26/06 |

(Continued)

OTHER PUBLICATIONS

Bade et al., Fabrication and Characterization of a Mode-Selective 45-Mode Spatial Multi-Plane Light Conversion, Optical Fiber Communication Conference 2018, San Diego, California United States, (Mar. 11-15, 2018), ISBN: 978-1-943580-39-2.

(Continued)

*Primary Examiner* — Daniel Petkovsek
(74) *Attorney, Agent, or Firm* — TraskBritt

(57) ABSTRACT

A light source comprising: —at least one semiconductor chip capable of emitting incident radiation: —an output stage comprising at least one fiber or free space for propagating a plurality of predefined modes; —at least one optical part having a microstructured main surface arranged opposite the semiconductor chip for intercepting the incident radiation, spatially modifying the phase of the incident radiation and forming, by a plurality of reflections and/or transmissions on the optical component, transformed light radiation comprising at least the predefined modes.

20 Claims, 4 Drawing Sheets

(56) References Cited

U.S. PATENT DOCUMENTS

| | | | |
|---|---|---|---|
| 9,250,454 | B2 | 2/2016 | Morizur et al. |
| 9,566,751 | B1 | 2/2017 | Nichol |
| 11,231,551 | B2* | 1/2022 | Labroille ............... G02B 6/264 |
| 2009/0201575 | A1 | 8/2009 | Fermann et al. |
| 2017/0010463 | A1* | 1/2017 | Morizur ................ G01J 1/4257 |
| 2021/0149114 | A1* | 5/2021 | Labroille ............. G02B 6/2555 |
| 2022/0146754 | A1* | 5/2022 | Schiffer ............... G02B 6/2938 |

FOREIGN PATENT DOCUMENTS

| | | | | |
|---|---|---|---|---|
| FR | 3078412 | A1 | 8/2019 | |
| WO | WO-2019129949 | A1* | 7/2019 | ............. G02B 27/62 |

OTHER PUBLICATIONS

Fontaine et al., Design of High Order Mode-Multiplexers using Multiplane Light Conversion, 2017 European Conference on Optical Communication (ECOC), 2017, pp. 1-3.

International Search Report International Application No. PCT/FR2020/051076 dated Nov. 24, 2020, 3 pages.

International Written Opinion International Application No. PCT/FR2020/051076 dated Nov. 24, 2020, 9 pages.

Morizur et al., Programmable Unitary Spatial Mode Manipulation, J. Opt. Soc. Am. A/vol. 27, No. 11, Nov. 2010, pp. 2524-2531.

Treusch et al., High Power Diode Laser Arrays, Source: High-Power Diode Laser Arrays, Chapeter 6 of High-Power Laser Handbook by Injeyan et al., (Jan. 5, 2011, Technology & Engineering, pp. 134-159.

Fu et al., Investigation of Single Mode Fiber Coupling using Diffractive Optical Element with Continuous Relief Fabricated by Focused Ion Beam Technology, Optical Fiber Communication Conference (OFC), Technical Digest Postconference Edition, (Mar. 17-22, 2001), pp. ThC3_1-ThC3_3.

Gale et al., Direct Laser Writing of Planar Fresnel Elements for Optical Interconnects, Institute of Physics Conference Series, IOP Publishing, No. 139, Part 2, (Aug. 1994), pp. 267-270.

Chinese Office Action for Application No. 202080045082.5 dated Jul. 29, 2023, 18 pages with machine translation.

Labroille et al., Characterization and Applications of Spatial mode Multiplexers Based on Multi-Plane Light Conversion, Optical Fiber Technology, vol. 35, Feb. 2017, pp. 93-99.

* cited by examiner

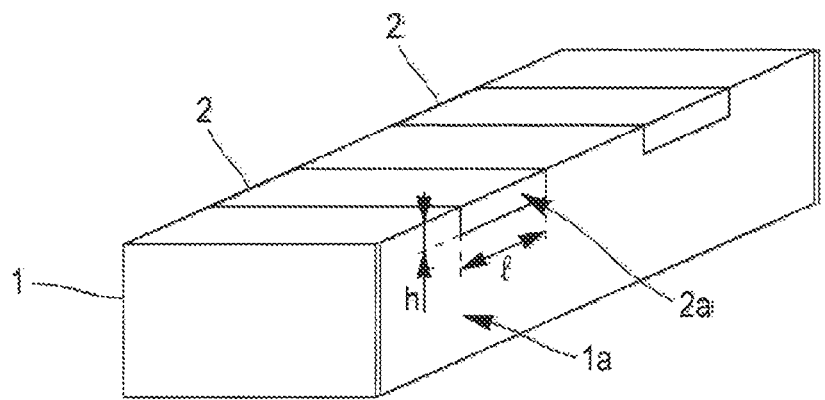
Fig. 1 – prior art
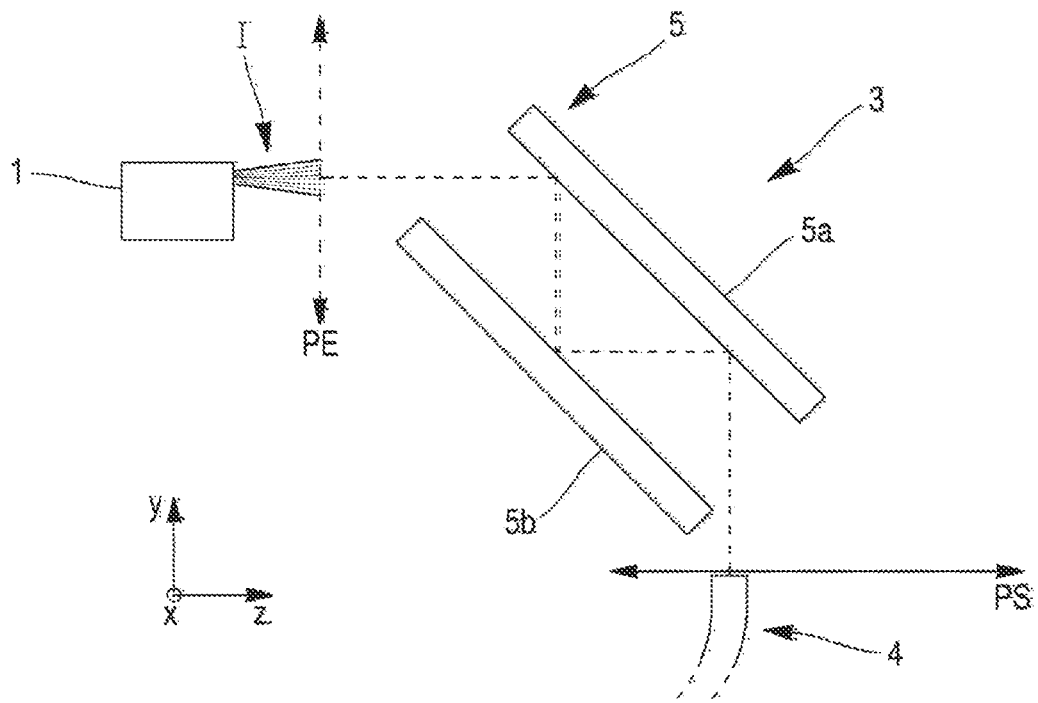
Fig. 2

LIGHT SOURCE COMPRISING AT LEAST ONE SEMICONDUCTOR CHIP BEARING AT LEAST ONE DIODE

CROSS-REFERENCE TO RELATED APPLICATIONS

This application is a national phase entry under 35 U.S.C. § 371 of International Patent Application PCT/FR2020/051076, filed Jun. 19, 2020, designating the United States of America and published as International Patent Publication WO 2020/254774 A1 on Dec. 24, 2020, which claims the benefit under Article 8 of the Patent Cooperation Treaty to French Patent Application Serial No. 1906718, filed Jun. 21, 2019.

TECHNICAL FIELD

The present disclosure relates to a light source comprising a semiconductor chip bearing at least one diode.

BACKGROUND

A laser diode array forms a high-power laser source based on semiconductors. The diodes can have a high level of electro-optical conversion efficiency and high power, and they are arranged very compactly either linearly or in a matrix. The laser diodes of the array are sometimes referred to as "broad area laser diodes," according to the terminology generally used. The radiation emitted by this type of laser diode is multi-mode in nature, and so such diodes are therefore clearly distinguished from gain- or index-guided laser diodes in which single-mode radiation is sought.

Such an array generally consists of a semiconductor chip, for example, based on GaAs or GaN, bearing the laser diodes arranged on a heat-dissipating substrate, sometimes via an intermediate layer. Electrical contacts are arranged on the chip and are connected to power supply pins of the array. FIG. 1 thus schematically shows a semiconductor chip 1 bearing laser diodes 2 from the prior art. The emission surfaces 2a of the diodes 2 are arranged on a main face 1a of the chip 1. The emission surfaces 2a are generally extended and have, as can be seen in the example of FIG. 1, a width l typically of approximately 100 μm or more and a reduced vertical dimension h, of approximately a micrometer.

The light radiation coming from such an array therefore consists of a plurality of beams aligned to form an emission strip. The vertical dimension h of each diode defines a so-called fast axis, which exhibits a significant divergence of approximately from 30 to 40° FWHM but a good beam quality (beam quality factor M2 close to one). The horizontal dimension € of each diode defines a so-called slow axis, which has a smaller divergence, typically of approximately from 6° to 10°, but a poor beam quality (beam quality factor M2 greater than 1,000).

It is therefore generally intended for the radiation produced by the array to be conditioned. This conditioning can be partly integrated into the array, for example, in the form of a cylindrical lens arranged opposite the emission surfaces 2a, so as to collimate the radiation emitted in at least the fast direction. In addition to the optical part that may be integrated into the array, additional optical parts may also be provided to shape the light beam. It is thus possible to intend to make the beam more symmetrical and/or of better quality (as measured, for example, by the parameter M2) in order to feed it into a conventional optical fiber having a substantially circular core. More generally, the aim is to shape the light radiation emitted by the diodes so that it has the lowest possible optical range.

U.S. Pat. No. 5,513,201 thus discloses an optical device aimed at rearranging the radiation emitted by the array from a first arrangement in which the instances of radiation emitted by the diodes 2 are arranged side by side, by juxtaposing their slow axes to form a strip of radiation, to a second arrangement in which the instances of radiation are arranged side by side so as to be juxtaposed by their fast axes. In this way, the light radiation is made more compact, which facilitates its feeding into an optical fiber.

INJEYAN, Hagop and GOODNO, Gregory D. *High power laser handbook*. New York: McGraw-Hill Professional, 2011 also provides numerous examples of optical arrangements aimed at shaping the beam emitted by a laser array to facilitate coupling with an optical fiber. This may involve shaping by means of a "Southampton" optical assembly, by stepped mirrors, or by refractive optical parts such as microprisms, which deflect the radiation from each laser diode into parallel planes in which microlenses are arranged to collimate it and form a matrix of small-sized beams. In all cases, the aim is to feed the beam shaped in this way into a fiber. It is also conceivable for a spherical lens to be inserted to facilitate this.

Finally, Yongqi Fu, et. al., "Investigation of single mode fiber coupling using diffractive optical element with continuous relief fabricated by focused ion beam technology," OFC 2001. Optical Fiber Communication Conference and Exhibit, Technical Digest Postconference Edition, proposes to couple the lasers of an array to fibers by means of a block of lenses formed by "quasi phase agreement by Fresnel birefringence" or "Fresnel phase matching" elements (FPME).

Whatever solution is chosen to carry out this coupling, the aim is to couple, of course, a maximum of the optical power emitted by the diodes into the optical fiber.

BRIEF SUMMARY

An aim of the present disclosure is to propose an original solution to this problem.

In order to achieve this aim, the object of the present disclosure proposes a light source comprising:
- at least one semiconductor chip capable of emitting multi-mode incident radiation;
- an output stage comprising at least one fiber or free space for propagating a plurality of predefined modes; and
- a modal transformation device arranged between the semiconductor chip and the output stage, the modal transformation device 5 comprising at least one optical part having a microstructured main surface arranged opposite the semiconductor chip, the modal transformation device being configured to intercept the incident radiation during a plurality of instances of reflection and/or transmission on the optical part, and the microstructured main surface being configured to spatially modify the phase of the incident radiation and to form, by the plurality of instances of reflection and/or transmission on the optical part, transformed light radiation comprising at least the predefined modes. According to other advantageous and non-limiting features of the present disclosure, taken alone or in any technically feasible combination:
  - the microstructured surface is configured to decompose the incident radiation according to a plurality of input modes of an input plane associated with a plurality of output modes defined in an output plane to form the transformed radiation;

the output stage comprises at least one multi-mode fiber;

more than 90% of the transformed light radiation is coupled into a feed end of the fiber;

the incident radiation comprises a first number of modes and the multi-mode fiber is capable of guiding a second number of modes, the second number being greater than or equal to the first;

the output stage is configured to allow free propagation of the transformed radiation;

the incident radiation emitted by the semiconductor chip is produced by a laser diode or a light-emitting diode;

the incident radiation emitted by the semiconductor chip is produced by a single diode;

the incident radiation emitted by the semiconductor chip is produced by a plurality of diodes each emitting multi-mode or single-mode radiation;

the light source comprises a device for shaping the incident radiation, arranged between the semiconductor chip and the optical part;

the shaping device comprises a plurality of multi-mode fibers into which parts of the incident radiation are respectively fed; and the microstructuring of the main surface takes place with separable variables.

BRIEF DESCRIPTION OF THE DRAWINGS

Other features and advantages of the present disclosure will become apparent from the detailed description of the present disclosure that follows with reference to the accompanying figures, in which:

FIG. 1 shows a semiconductor chip bearing laser diodes from the prior art;

FIG. 2 shows an example of a light source incorporating the principles of the present disclosure;

DETAILED DESCRIPTION

Figure 3A:
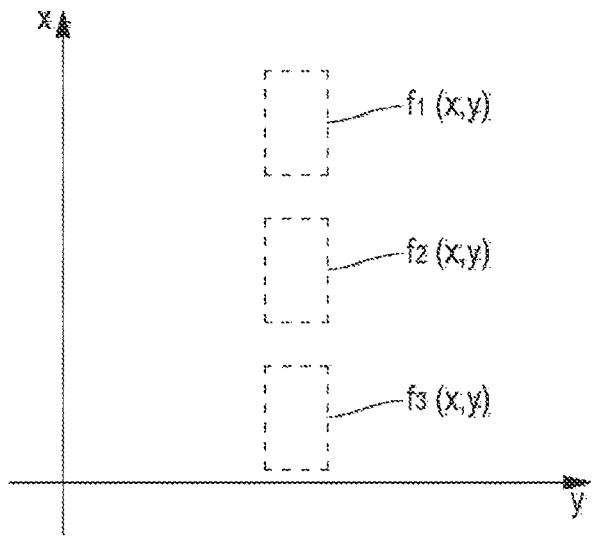
FIGS. 3a and 3b respectively show an example of modal decomposition of the incident radiation in an input plane and the transformed radiation in the output plane.

For the sake of clarity, in the present disclosure light radiation is defined as radiation formed from at least one mode of the electromagnetic field, each mode forming a spatio-frequential distribution of the amplitude, phase, and polarization of the field. Accordingly, shaping, modifying or transforming light radiation refers to the spatio-frequential modification or transformation of the modes of the radiation.

The "shape" of radiation means the transverse distribution of the amplitude and the phase of the mode or the combination of the transverse amplitude and phase distributions of the modes making up this radiation.

For the sake of simplicity, it will be assumed in the present description that the radiation is polarized in a single direction and has a single frequency. However, the principles set out are entirely applicable to radiation having more than one direction of polarization or more than one single frequency.

FIG. 2 is a top view of an example of a light source 3 incorporating the principles of the present disclosure.

It comprises a semiconductor chip 1 comprising a plurality of laser diodes, with three in the example shown. It would be possible, of course, to provide a different number of such diodes, typically between 1 and 100. If a single laser diode is provided, it will emit multi-mode radiation in order to be able to take advantage of a device according to the present disclosure. If a plurality of diodes is provided, they may emit either single-mode or multi-mode radiation. In the frame of reference of FIG. 2, the chip 1 is arranged such that the emission surfaces of the laser diodes are all arranged vertically along the x axis. It is conceivable for them to be arranged differently, in another direction or in a matrix, for example, which matrix could be obtained by stacking a plurality of semiconductor chips similar to that shown in FIG. 1 one on top of the other. Although this is not shown in FIG. 2, the chip 1 can be instrumented with a collimating lens or a plurality of such lenses, for example, a cylindrical lens placed opposite the diode emission surfaces, a heat-dissipating support and any other element useful for forming a laser diode array.

Regardless of the chosen configuration of the semiconductor chip (or chips) 1, the diodes it bears emit incident radiation I. The light source 3 shown in FIG. 2 also comprises an output stage 4, which in this case consists of a single multi-mode optical fiber 4. This fiber has a feed end for collecting the light radiation emitted by the semiconductor chip 1 after this radiation has been shaped by the other optical parts constituting the light source 3 to form transformed radiation. The output stage can include collimation optics (not shown in the figure) to promote the collection of the radiation transformed in the fiber 4. In general, the fiber (or the plurality of fibers) arranged at the output stage will be chosen so that it can (collectively) accommodate the number of modes making up the incident radiation I. For example, if the semiconductor chip 1 consists of 5 diodes each emitting radiation consisting of 100 modes, a multi-mode fiber 4 (or a collection of such fibers) will be chosen, which can guide (collectively) at least the 500 modes making up the incident radiation I. In other words, the incident radiation comprises a first number of modes and the multi-mode fiber is capable of guiding a second number of modes, the second number being greater than or equal to the first. However, the aim is to limit, as much as possible, the number of modes of the multi-mode fiber(s) so as not to excessively increase the diameter of the fiber and guide radiation exhibiting a high energy concentration in this fiber.

The fiber or the plurality of fibers arranged in the output stage can be graded-index fibers or, preferably, step-index fibers.

FIG. 2 also shows an input plane PE and an output plane PS, these planes being transverse with respect to the incident radiation I emitted by the diodes and to the transformed radiation being fed into the fiber 4, respectively.

To allow efficient coupling of the incident radiation I into the fiber 4, the present disclosure proposes to process this incident radiation modally, i.e., to carry out a modal conversion aimed at transporting the energy of the incident radiation respectively present in input modes to output modes, these output modes being suitable for being efficiently coupled to the fiber 4.

FIG. 3a shows an example of modal decomposition in the input plane PE of the radiation emitted by the laser diodes 2, which has propagated as far as this input plane PE. This plane is provided with a Cartesian frame of reference (x, y) in which the incident radiation I can be modally decomposed, in this case into three modes $f1(x, y)$, $f2(x, y)$ and $f3(x, y)$, the functions f1, f2 and f3 determining the amplitude and the phase of each of these modes. In general, the number and nature of the modes in the input plane PE will be determined so that the radiation incident on the plane PE can be decomposed as accurately as possible. The family of input modes can form, in particular, a base.

Figure 3B:
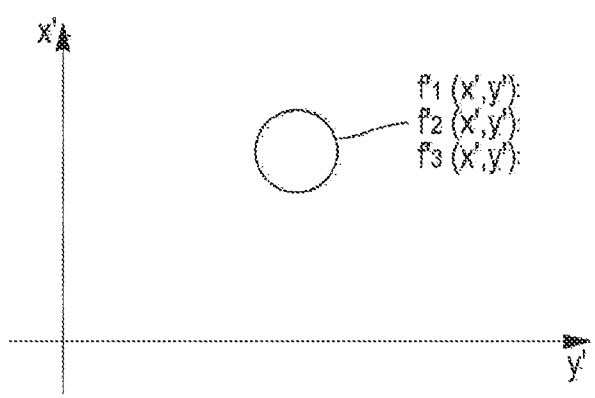

Similarly, the radiation transformed in the output plane PS can be decomposed using a family of output modes of which the cardinality is the same as that of the input family, and which is best coupled to the fiber 4. In the example shown in FIG. 3*b*, the transformed radiation is formed from the first three LP modes f'1, f'2, f'3 centered on the optical fiber 4. This decomposition is consistent with the first LP modes guided by the multi-mode fiber 4, which allows these guided modes to be adequately "filled" by the transformed radiation. It should be noted that, in the context of the present disclosure, the aim is to feed as much power as possible into the fiber, and it is irrelevant whether this power is fed in one guided mode rather than another. For example, more than 90% of the transformed radiation is coupled into a feed end of the multi-mode fiber 4.

Between the input plane and the output plane, a modal transformation device is provided, which, in this case, comprises a first reflective optical part 5*a* arranged opposite a second reflective optical part 5*b*, so as to define a multi-passage cavity in which the incident radiation I propagates toward the output stage 4. The first optical part 5*a* has a microstructured surface that intercepts the incident light radiation I a plurality of times during its propagation. Each reflection on the microstructured surface 5*a* spatially modifies the phase of this radiation so that, following the multiple reflections, the incident radiation is transformed so as to be coupled to the fiber 4, which forms the output stage in this example.

The term "microstructured surface" means that the surface of the optical part has a relief, which can, for example, be broken down in the form of "pixels" whose dimensions are from a few microns to a few hundred microns. The relief or each pixel of this relief has a variable elevation with respect to a mean plane defining the surface in question, of at most a few microns or at most a few hundred microns. An optical part having such a microstructured surface forms a phase mask introducing a local phase shift within the transverse section of the radiation that is reflected there or transmitted there.

The microstructuring of the first part is produced digitally (using optical design software) to allow the transformation of the incident radiation into the transformed radiation capable of coupling to the fiber 4. In other words, the microstructured surface is configured to associate, i.e., transform, the input modes, as, for example, defined in FIG. 3*a*, with the output modes that correspond substantially to those guided by the fibers, in this case the first three LP modes of the fiber. The microstructured surface that intercepts the incident radiation a plurality of times decomposes the radiation according to the input modes that are transformed into the output modes to form the transformed radiation. To continue with the example shown in FIG. 2, the microstructured surface could thus be configured to transform the input modes into the output modes, for example, so that the input mode f1 is associated with the output mode f'1, the mode f2 is associated with the mode f'2, and the mode f3 is associated with the mode f'3. Any linear and unitary transformation between the output modes and the input modes is possible.

The documents *"Programmable unitary spatial mode manipulation,"* Morizur et al. *J. Opt. Soc. Am. A*/Vol. 21, No. 11/November 2010; N. Fontaine et al., (ECOC, 2017), "Design of High Order Mode-Multiplexers using Multiplane Light Conversion"; U.S. Pat. No. 9,250,454 and US2017010463 contain the theoretical foundations and embodiment examples of such a modal conversion device.

Thus, light radiation that propagates between the optical parts 5*a*, 5*b* undergoes a succession of local phase shifts separated by propagations. The succession of these elementary transformations (for example, at least four successive transformations such as 8, 10, 12, 14, or even at least 20 transformations, for example) establishes an overall transformation of the spatial profile of the incident radiation. It is thus possible to configure the microstructured surface to change the shape of the incident radiation I so that it is efficiently coupled to the fiber 4 of the output stage.

Of course, optical arrangements other than the multi-passage cavity formed by the reflective optical parts 5*a*, 5*b* are possible in order to achieve the desired modal transformation.

As such, and more generally, the light source 3 comprises at least one optical part, which forms a modal transformation device 5 having a microstructured main surface arranged opposite the semiconductor chip 1 for intercepting the incident radiation I by a plurality of reflections/transmissions (for example, at least four successive reflections/transmissions such as 8, 10, 12, 14, or even at least 20 reflections/transmissions) on one or more of the optical parts in order to establish the transformed radiation. Each reflection/transmission on a microstructured surface is followed by a propagation of the radiation in free space. Some of the optical parts can be microstructured and help to form the transformed radiation, and others can be simply reflective or transparent in order to guide this radiation.

In general, the aim is to limit the number of reflections and/or transmissions on the microstructured surfaces of the device 5. For example, the aim can be to limit this number to less than 20 or less than 10. This limits the absorption losses that occur with each reflection and/or transmission of the radiation, and limits the complexity of the design of the device, i.e., the definition of the microstructuring of the surface(s) involved; however, this may lead to a less accurate approximation of the implemented modal transformation.

In addition, to simplify the set-up (i.e., the number of reflections/transmissions), its design, or to seek a better approximation of the modal transformation (for a fixed number of reflections/transmissions), it is possible to arrange the modes of the input family and the modes of the output family such that the transformation takes place with separable variables. Such a transformation is described in *"Fabrication and Characterization of a Mode-selective 45-Mode Spatial Multiplexer based on Multi-Plane Light Conversion,"* Bade et al., *Optical Fiber Communication Conference Postdeadline Papers, OSA Technical Digest, Optical Society of America*, 2018, paper *Th4B*.3, pp. 1-3 and FR1851664. These documents demonstrate that such a transformation allows a reduction in the number of reflections/transmissions constituting the modal transformation device 5.

A mode family is said to have separable variables when $f_{ij}(x, y) = h_i(x) \cdot g_j(y)$ can be written for each mode i, j of the family.

In the input plane PE and output plane PS provided with their respective Cartesian frames of reference (x, y) and (x', y'), there is a collection of N generating functions $h_i(x)$ and $h'_i(x')$ defined respectively in the input plane and in the output plane and a collection of M generating functions $g_j(y)$ and $g'_j(y)$ also defined respectively in the input plane and in the output plane.

These generating functions are used to define the N*M input modes $f_{ij}(x, y)=h_i(x)\cdot g_j(y)$ and N*M output modes $f'_{ij}(x', y')=h'_i(x')\cdot g'_j(y')$ having separable variables, $1<=i<=N$ and $1<=j<=M$.

To take advantage of the separability property of the variables and to simplify the design of the modal transformation device 5, a separable-variable transformation performed by this device must associate each mode of rank i, j of the input plane with the mode of the same rank i, j in the output plane. In other words, for any pair (i, j), the mode $f_{ij}(x, y)=h_i(x)\cdot g_j(y)$ of the input plane is transformed by the device 5 into the mode $f'_{ij}(x', y')=h'_i(x')\cdot g'_j(y')$ of the output plane.

Once these constraints relating to the mode families and their associations, a numerical optimization step in accordance with the prior art can be used to establish the phase shift quantities φ1(x, y) ($1<=1<=M$, M denoting the number of reflections/transmissions on the optical part) of the microstructured surface, which allow the family of input modes to be transformed as accurately as possible into the family of output modes. Specifically, the phase values φ1($x_k$, $y_k$) are sought at every pixel ($x_k$, $y_k$) on the surface of the optical part at each of the M reflections/transmissions. These phase shifts can be easily transformed into an elevation of each pixel, which will make it possible to produce the microstructured surface at each reflection/transmission to form M phase masks. Each of the M phase masks has the property of having separable variables or is close to having this property, i.e., that the phase shift φ1(x, y) satisfies the relation φ1(x, y)=$\Psi_1$(x)+$\theta_1$(y) where $\Psi_1$ and $\theta_1$ are phase generating functions. Consequently, the microstructured surface (or more precisely the microstructuring of this surface) also has this property, i.e., at each reflection/transmission, the relief or the elevation e of the microstructuring at a point ($x_k$, $y_k$) can be written in the form e($x_k$, $y_k$)=u($x_k$)+v($y_k$), where u and v are two elevation generating functions.

Figure 4:
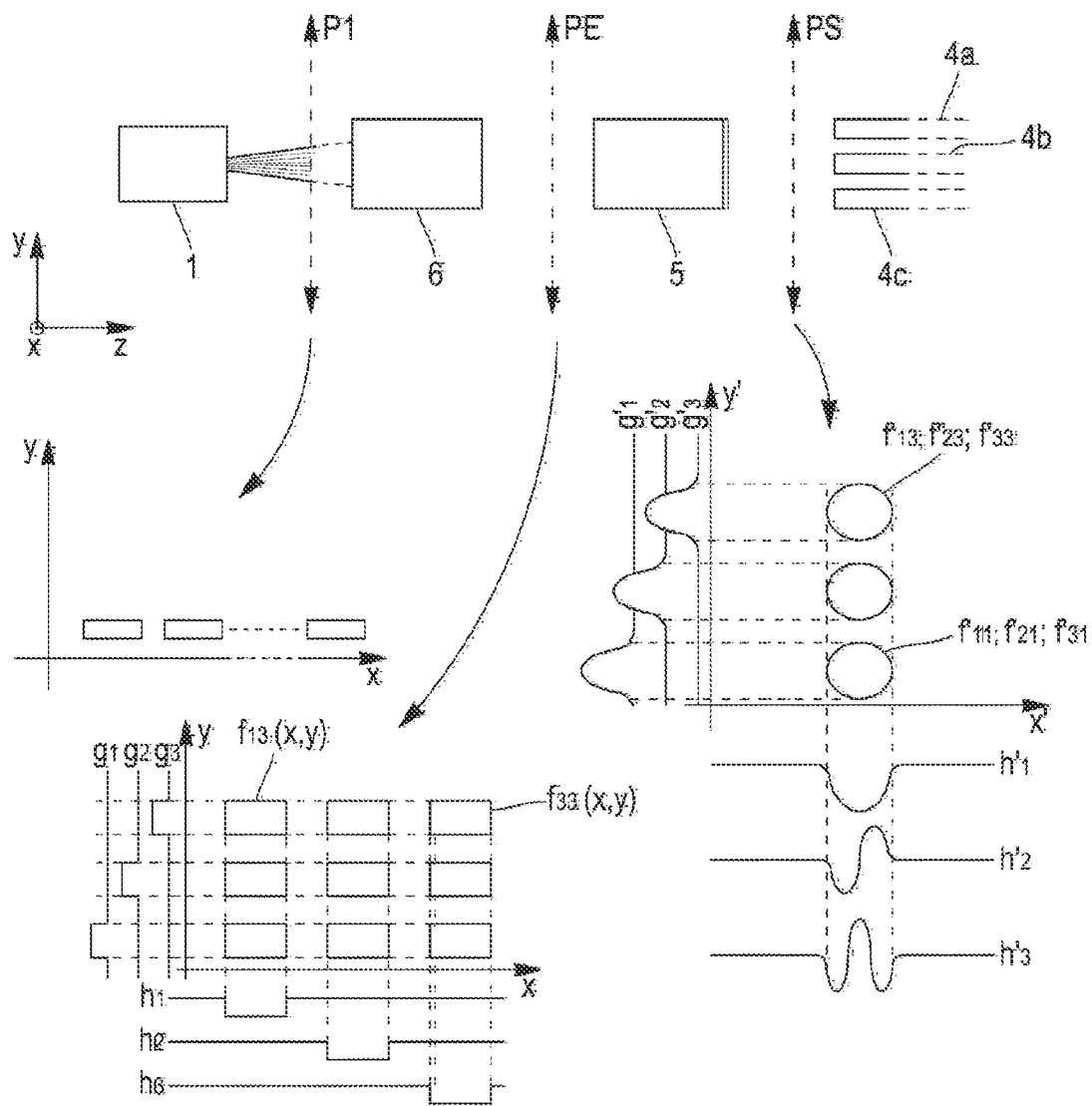
FIG. 4 shows a second example of a light source incorporating the principles of the present disclosure.

FIG. 4 schematically shows an example of a light source 3 that implements such a modal transformation with separable variables. FIG. 4 clearly shows the semiconductor chip 1 comprising, in this case, 9 laser diodes arranged linearly along the x axis. The laser source 1 emits incident radiation, the transverse distribution of which in a plane P1 is shown schematically on a first insert in FIG. 4. The linear distribution of the radiation from each diode of the semiconductor chip 1 can be seen.

In the set-up of this embodiment, there is a device 6 for shaping the incident radiation I so as to arrange this radiation in an input plane according to an arrangement with separable variables. As is clearly visible on the second insert of FIG. 4, the radiation emitted by the laser diodes has been rearranged in the form of a matrix. In this way, 9 input modes are defined, which are described by the functions $f_{11}$(x, y) to $f_{33}$(x, y), and it is verified that each input mode is the product, in the input plane PE, of the generating functions $h_1$(x), $h_2$(x), $h_3$(x) and $g_1$(y), $g_2$(y), $g_3$(y). It should be noted that such a shaping device 6 is optional, in particular, when the incident radiation I can be naturally decomposed by a family of input modes having separable variables (in the case of a matrix arrangement of the radiation emitted by a plurality of stacked semiconductor chips 1).

The light source 3 shown in FIG. 4 also comprises an output stage 4, in this case it comprises a bundle of three multi-mode optical fibers 4a, 4b, 4c arranged in a plane (y, z) in the frame of reference associated with the set-up. It should be noted that the choice of placing three fibers in the output stage is intended to show the versatility of the solution, and the general aim in most applications is to feed the incident radiation into a single multi-mode fiber in order to concentrate all the energy there. The output plane PS is provided with a Cartesian frame of reference (x', y') and the third insert of FIG. 4 shows the 9 families of output modes $f'_{11}$(x', y') to $f'_{33}$(x', y'). Three modes of this family are respectively associated with a multi-mode fiber, i.e., are arranged spatially so as to face the feed end of this fiber. These three modes are therefore spatially superimposed on one another in the output plane PS.

The third insert shows the generating functions $h'_1$(x'), $h'_2$(x'), $h'_3$(x) and $g'_1$(y'), $g'_2$(y'), $g'_3$(y'). It is verified on this insert that the feature of separability of the variables is present.

The device 5 implementing the modal conversion uses the principles set out in relation to the description of FIG. 2. The microstructuring of the surface or surfaces of the optical parts that make up the device 5 has been configured to implement the modal transformation so as to associate each input mode of rank (i, j) with the output mode of the same rank (i, j). In other words, and in a very simplified and less than rigorous manner, the generating functions of the input plane are transformed into the generating functions of the output plane. This relation ensures a form of transformation order that makes it possible to greatly simplify the design of the modal transformation device 5, for example, by reducing the number of reflections/transmissions on a microstructured surface for a given transformation accuracy.

The device 6 for shaping the incident radiation I can be implemented in many ways. It may be a modal transformation device similar to that of the device 5, which implements a plurality of reflections and/or transmissions on at least one microstructured surface, followed by free propagations. In this case, the shaping device 6 can be physically separated from the modal transformation device 5, or the two devices may be integrated to form a single device.

In an alternative, the shaping device 6 can be implemented by more conventional optical parts. It may thus be a plurality of stepped mirrors each capturing a portion of the radiation emitted by the laser diodes in order to stack these portions on top of each other to form the matrix distribution of FIG. 4. In yet another alternative, the shaping device 6 can comprise refractive optical parts such as microprisms, which deflect the radiation from each laser diode into parallel planes in which microlenses are arranged to collimate it and form a matrix of small-sized beams.

Figure 5:
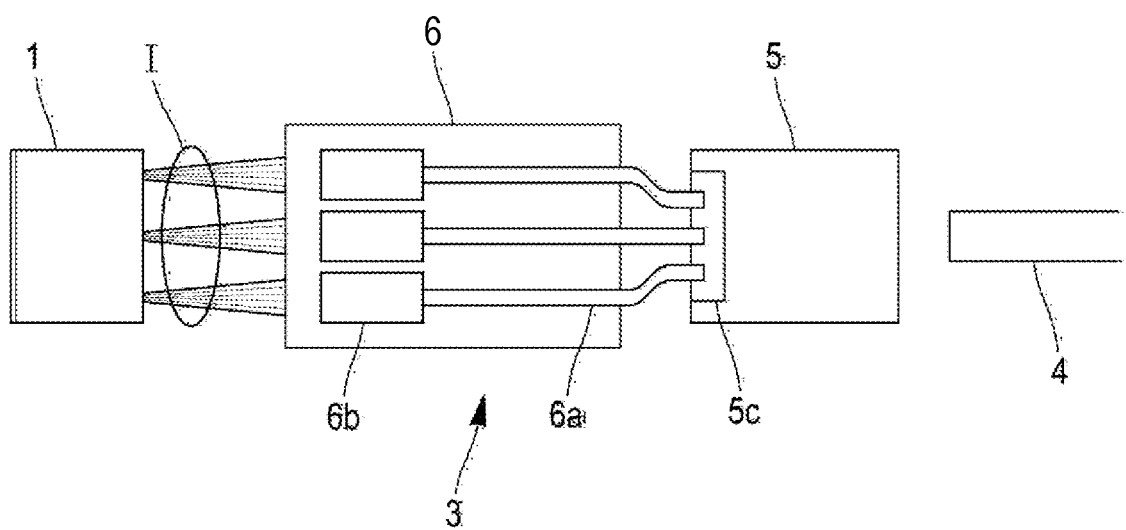
FIG. 5 shows another example of a light source incorporating the principles of the present disclosure.

FIG. 5 shows another embodiment of the present disclosure. The light source 3 comprises a stack of 3 semiconductor chips 1, with each chip here comprising a plurality of laser diodes arranged linearly along the x axis. Consequently, the incident radiation I is represented in FIG. 5 as a collection of 3 instances of elementary radiation, each instance of elementary radiation consisting of the radiation emitted by a plurality of laser diodes.

The aim is to shape this incident radiation I to facilitate the feeding of a maximum of the power emitted by the stack of chips 1 into a multi-mode fiber 4. To do this, collective processing of the elementary radiation is avoided, and instead, a shaping device 6 is provided, which separately processes parts of the incident radiation. The shaping device 6 is arranged between the semiconductor chips 1 and the modal transformation device 5. It comprises a plurality of multi-mode fibers 6a into which the radiation produced by pluralities of diodes is fed at a first end of these fibers via a plurality of feed devices 6b. These feed devices 6b can use conventional optical parts (lenses, stepped mirrors, microprisms, etc. as has been mentioned previously) or implement an MPLC device similar to the modal transformation device 5 already described. Separately processing parts of the incident radiation I for coupling to a plurality of optical fibers provides improved coupling, and more energy is captured than if attempts had been made to couple the incident radiation entirely into a single fiber.

The other ends of the multi-mode fibers 6a of the shaping device 6 form an input stage 5c of the modal transformation device 5. As in the previous examples, this is configured to effect a transformation of the radiation produced by the multi-mode fibers 6a so as to transport its energy into the guided modes of the multi-mode optical fiber 4.

Of course, the present disclosure is not limited to the embodiments described and it is possible to add variants without departing from the scope of the present disclosure as defined by the claims.

It is conceivable for the modal transformation device 5 to carry out more complex transformations of the incident radiation than those that have been described. It is conceivable, for example, to use the device 5 to optically compensate for any deflection of the semiconductor chip 1 in the direction of arrangement of the diode emission surfaces. This deflection changes the strip shape of the radiation from a perfect straight line (in the shape of a "smile"), which is generally not desirable.

Furthermore, it is not necessary for the source 1 to include an output stage 4 consisting of one or a plurality of optical fibers. The output stage can also allow the free propagation of the radiation transformed by the modal transformation device 5. However, it will be sought in all cases for the radiation transformed by this device to conform to a plurality of predefined modes, whether these are imposed by a fiber of the output stage or chosen to propagate freely. In addition, the output stage 4 can comprise other elements such as lenses or optical parts other than those that have been described in the specific examples of the present description.

Finally, the present disclosure is not limited to broad-area laser diodes or even to a laser semiconductor chip; it applies to any light source comprising a semiconductor chip capable of emitting multi-mode light radiation. The semiconductor chip and the source can implement, in particular, at least one light-emitting diode.

The present disclosure is of particular interest for applications in the field of LIDAR or for the combination of quantum cascade lasers.

The invention claimed is:

1. A light source, comprising:
   at least one semiconductor chip configured to emit multi-mode incident radiation;
   an output stage comprising at least one fiber or free space for propagating a plurality of predefined modes; and
   a modal transformation device arranged between the semiconductor chip and the output stage, the modal transformation device comprising at least one optical part having a microstructured main surface arranged opposite the semiconductor chip, the modal transformation device configured to intercept the incident radiation during a plurality of instances of reflection and/or a plurality of instances of transmission on the optical part, the microstructured main surface configured to spatially modify the phase of the incident radiation and to form, by the plurality of instances of reflection and/or a plurality of instances of transmission on the optical part, transformed light radiation comprising at least the predefined modes.

2. The light source of claim 1, wherein the microstructured main surface is configured to decompose the incident radiation according to a plurality of input modes of an input plane associated with a plurality of output modes defined in an output plane to form the transformed light radiation.

3. The light source of claim 2, wherein the output stage comprises at least one multi-mode fiber.

4. The light source of claim 3, wherein more than 90% of the transformed light radiation is coupled into a feed end of the multi-mode fiber.

5. The light source of claim 4, wherein the incident radiation comprises a first number of modes and the multi-mode fiber is capable of guiding a second number of modes, the second number being greater than or equal to first.

6. The light source of claim 5, wherein the incident multi-mode incident radiation emitted by the semiconductor chip is produced by a laser diode or a light-emitting diode.

7. The light source of claim 6, wherein the multi-mode incident radiation emitted by the semiconductor chip is produced by a single diode.

8. The light source of claim 6, wherein the multi-mode incident radiation emitted by the semiconductor chip is produced by a plurality of diodes each emitting multi-mode or single-mode radiation.

9. The light source of claim 6, further comprising a shaping device for shaping the incident radiation, the shaping device being located between the semiconductor chip and the optical part.

10. The light source of claim 9, wherein the shaping device comprises a plurality of multi-mode fibers into which parts of the incident radiation are respectively fed.

11. The light source of claim 2, wherein the output stage is configured to allow the free propagation of the transformed light radiation.

12. The light source of claim 1, wherein the output stage comprises at least one multi-mode fiber.

13. The light source of claim 12, wherein more than 90% of the transformed light radiation is coupled into a feed end of the multi-mode fiber.

14. The light source of claim 12, wherein the incident radiation comprises a first number of modes and the multi-mode fiber is capable of guiding a second number of modes, the second number being greater than or equal to first.

15. The light source of claim 1, wherein the output stage is configured to allow the free propagation of the transformed light radiation.

16. The light source of claim 1, wherein the incident multi-mode incident radiation emitted by the semiconductor chip is produced by a laser diode or a light-emitting diode.

17. The light source of claim 1, further comprising a shaping device for shaping the incident radiation, the shaping device being located between the semiconductor chip and the optical part.

18. The light source of claim 17, wherein the shaping device comprises a plurality of multi-mode fibers into which parts of the incident radiation are respectively fed.

19. The light source of claim 1, wherein the microstructuring of the main surface takes place with separable variables.

20. The light source of claim 1, wherein the plurality of instances of reflection and/or the plurality of instances of transmission on the optical part comprise a plurality of instances of reflection, and the microstructured main surface is configured to spatially modify the phase of the incident radiation and to form, by the plurality of instances of reflection, the transformed light radiation comprising at least the predefined modes.

* * * * *